United States Patent
Camuffo et al.

(10) Patent No.: US 8,193,858 B2
(45) Date of Patent: Jun. 5, 2012

(54) SETTING AN OUTPUT LEVEL OF AN AMPLIFIER APPARATUS

(75) Inventors: Andrea Camuffo, Munich (DE); Andreas Langer, Unterschleissheim (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 12/554,534

(22) Filed: Sep. 4, 2009

(65) Prior Publication Data

US 2010/0079209 A1    Apr. 1, 2010

(51) Int. Cl.
*H03G 3/20* (2006.01)

(52) U.S. Cl. .......................... 330/140; 330/278

(58) Field of Classification Search .................. 330/140, 330/278–279, 127, 291; 455/115, 126, 127.2
See application file for complete search history.

(56) References Cited

U.S. PATENT DOCUMENTS 7,733,176 B2 * 6/2010 Magoon et al. ............... 330/140

* cited by examiner

*Primary Examiner* — Hieu Nguyen
(74) *Attorney, Agent, or Firm* — SpryIP, LLC

(57) ABSTRACT

An amplifier module comprises an amplifier with an output and a coupling element for receiving a signal at the output. It also comprises a control input for receiving a control signal and a power detector which can be changed over and is intended to determine a power signal from the signal. The power detector which can be changed over is coupled to the control input and is set up in such a manner that a dynamic range of the power detector can be changed on the basis of the control signal.

8 Claims, 2 Drawing Sheets

SETTING AN OUTPUT LEVEL OF AN AMPLIFIER APPARATUS

RELATED APPLICATIONS

This Application claims priority to German Patent Application No. 102008049665.0, which has a filing date of Sep. 30, 2008. The entire contents of the German Patent Application are hereby incorporated herein by reference.

BACKGROUND

In an electronic communication system, a transmitter may include an output amplifier, for example an amplifier apparatus, which raises the power of a transmission signal to an output level. The output level must be high enough to allow the transmission signal to be received by a receiver. In particular in a wireless communication system which is defined, for example, by one of the standards GSM (Global System for Mobile Communication), UMTS (Universal Mobile Telecommunication Standard) or W-CDMA (Wideband Code Division Multiple Access), the output level of a mobile terminal is predefined by a base station or according to a standardized specification.

In a time division multiplex method such as TDMA, the output level is switched according to a predefined time mask. In this case, a so-called isolation level of, for example, −36 dBm for GSM900 is first of all assumed. The output level is then raised or set to a target value (for example 5 dBm to 33 dBm for GSM900). Raising or setting the output level is also referred to as "ramping".

The operation of setting the output level is often controlled by detecting a value of the output level using a power detector. This value can be compared with a target value in a control loop and the operation of setting the output level can be corrected in such a manner that a desired target value is assumed. Such a closed control loop is also referred to as a "closed loop" or "closed power loop".

The problem in this case is that the bandwidth of the power level values which can possibly be assumed is generally wider than the bandwidth of known linear power detectors for measuring the output power. A closed control loop for monitoring the setting of an entire dynamic range of the transmitter therefore cannot be provided. Accordingly, the output power will usually be set with the aid of the closed control loop only in a section of the dynamic range. Sufficiently reliable control of the output power by way of the closed control loop will generally be expected for output powers of greater than 0 dBm.

Operations for controlling the output power which have a transition from an open operation of setting the output level, that is to say one which takes place without knowledge of the actual output level, a so-called "open loop" or "open power loop", to the closed control loop or closed loop are therefore usually carried out.

In order to have a desired transition spectrum, a repeatable transition between the open loop and the closed loop may be required.

SUMMARY

Implementations described herein provide a method for setting an output level of an amplifier apparatus, where the method makes it possible to set the output level of the amplifier apparatus as efficiently as possible.

In one implementation, a method may include the following acts: a) the output level is increased to a first level by means of a power control signal whilst simultaneously detecting the output level using a power detector; b) the power control signal is kept constant during an interval of time; c) the power detection range of the power detector is changed over, and d) the output level is increased by means of the power control signal whilst simultaneously detecting the output level using the power detector.

In another implementation, a power detector is provided, where the detector has a plurality of dynamic ranges. Such a power detector may have, for example, a plurality of detector diodes which are designed for the different dynamic ranges.

For example, at least two dynamic ranges may be provided. Regulation of the output level may be effected inside the first dynamic range. A first level of the output level will therefore be set in a reliable and repeatable manner. A known operation for setting the output power can then be carried out inside the second dynamic range. However, the starting point of the output level is set in a reliable manner in this case for the initially unregulated operation of setting the output power. This avoids the output power being set in a disproportionately fast or slow manner in this range or during subsequent regulated control of the output level. The transition spectrum between open loop operation and closed loop operation in the second dynamic range is within known limits.

The first level which simultaneously defines the boundary between the first dynamic range and the second dynamic range is, for example, in a range of approximately −20 dBm to approximately −10 dBm for a GSM900 system and is also referred to as the "pedestal power".

One implementation provides a power control loop for an output stage for use in a TDMA transmitter, the control loop having a power detector which can be changed over between at least two dynamic ranges. A first dynamic range may include low power levels which are below a pedestal power level (pedestal power range). Another dynamic range includes higher power levels which include the target output power of the transmission burst. The power detector is set in a dynamic range by means of a dedicated control signal.

The output power is regulated to the pedestal power in the pedestal power range of the power detector and in a closed loop mode, that is to say by regulating with a closed control loop. As soon as the pedestal power level is reached, the power detector is changed over to the other dynamic range, the power control signal being kept constant. The output power is actually increased (ramping) to the target output power starting from the pedestal power level, first in an open loop mode and then in a closed loop mode, the power detector being changed over to the other dynamic range.

In one implementation of the amplifier module, a serial interface is included for changing over the power detector. In this case, the power detector may have a multiplicity of dynamic ranges which are each set up for different frequency bands and/or target output powers.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

Figure 1:
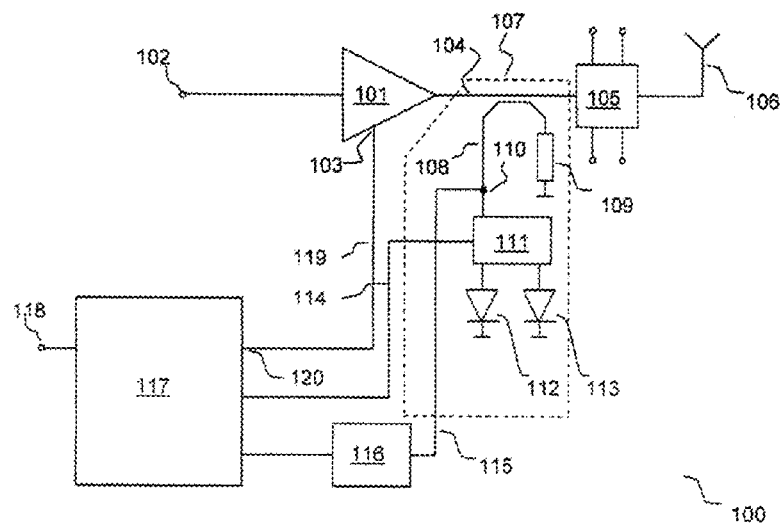
FIG. 1 shows an implementation of an amplifier apparatus.

FIG. 1 shows the block diagram of an embodiment of an amplifier apparatus. The amplifier apparatus 100 has an amplifier stage 101 which receives a transmission signal to be transmitted at an input 102. The transmission signal is amplified by the amplifier stage 101 to form an output transmission signal, amplification being effected according to a gain factor which is defined by an amplification control signal. The amplification control signal is received by the amplifier stage 101 at a setting input 103.

The output transmission signal is provided on an output line 104. The output line 104 is coupled to an antenna 106 via a circuit breaker 105. During transmitting operation, the circuit breaker 105 couples the amplifier stage 101 to the antenna 106. During receiving operation, the circuit breaker 105 couples the antenna 106 to a reception path of the transmitter, in which the amplifier apparatus 100 may be arranged. The reception path is not illustrated in FIG. 1. Various implementations for different designs of reception paths are known to a person skilled in the art.

The output line 104 is also coupled to a power detector 107. The power detector 107 comprises a return line 108. Part of the return line 108 runs parallel to the output line 104. Accordingly, the return line 108 has a parallel section. A first end of the parallel section runs in the direction of the antenna 106 and is provided with a terminating resistor 109 having a particular resistance value, for example 50 ohms. In other embodiments, the first end may be open, with the result that no terminating resistor is provided. A second end of the parallel section is connected to a node 110 via the return line. The power detector 107 thus receives a first signal which corresponds to an attenuated image of the amplified transmission signal. The node 110 is selectively connected to a first detector diode 112 or a second detector diode 113 via a switching apparatus 111. The switching apparatus 111 may be, for example, a simple switch or a multiplexer. A switching state of the switching apparatus 111 is selected by the value of a switching signal on a switching line 114.

The first detector diode 112 is designed to detect a signal level of the first signal in a first dynamic range of the output transmission signal. The second detector diode 113 is designed to detect a signal level of the first signal in a second dynamic range of the output transmission signal.

In this case, the first dynamic range is, for example, a range of −45 dBm to −20 dBm and the second dynamic range is a range of −20 dBm to 15 dBm.

A first line 115 connects the node 111 to an analog/digital converter 116. The analog/digital converter converts a power signal detected by the power detector into a digital signal and then provides an APC unit 117 with this signal.

The APC unit 117 has a target value connection 118. A target value signal can be fed into the target value connection 118, the target value signal representing a power level of the output transmission signal which is intended to be provided by the amplifier stage 101. The APC unit 117 determines a power control signal from the target value and the signal from the power detector 107. A control line 119 connects a control output 120 of the APC unit 117 to the power control input 103 of the amplifier stage 101.

The amplifier apparatus 100 has a return loop which is set up in such a manner that it can be used to regulate the operation of setting an output power of the amplifier stage 101.

The regulating operation is explained below using FIGS. 2 and 3.

Figure 2:
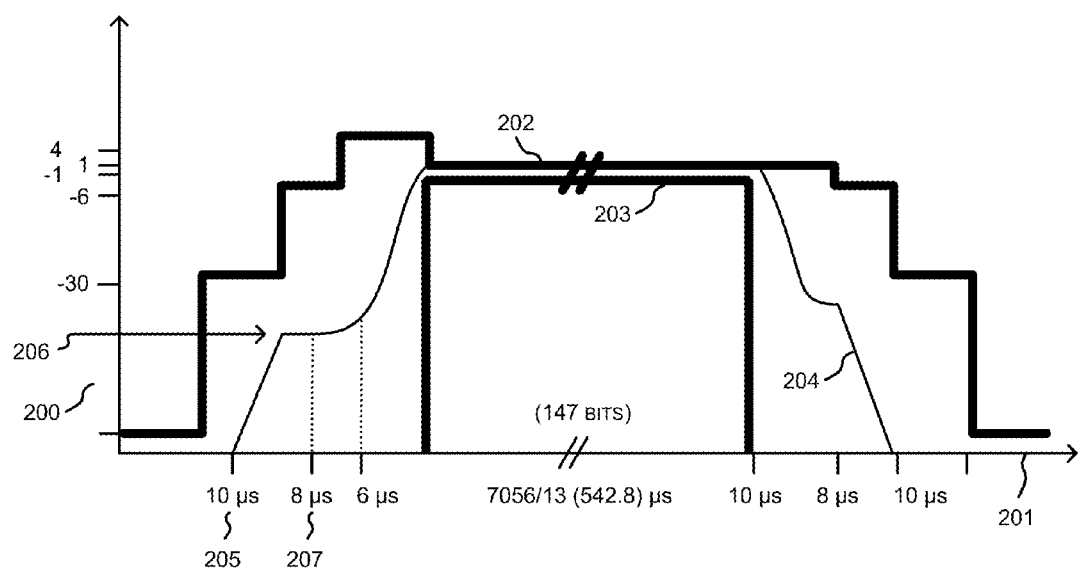
FIG. 2 diagrammatically shows a temporal profile of the output level set by a method according to one implementation described herein.

FIG. 2 diagrammatically shows a temporal profile of the output level set by a method according to one implementation described herein. In this case, a power level of the output transmission signal is illustrated on the abscissa 200 against time on the ordinate 201. The temporal profile of the output power is shown for one burst during a TDMA frame. In this case, the curves 202 and 203 illustrate the requirements which are predefined by the standard and within which the output power must lie so that the transmitter transmits the signal in a manner which conforms to the standard.

The curve 204 represents the profile of the output power. In this case, the power of the amplifier apparatus is increased linearly from a starting time 205 until it reaches a first level 206. This first level 206 corresponds to the pedestal power. During this period of time, the amplifier apparatus is switched on and the gain factor is continuously increased. This is carried out in a closed loop mode, the switching apparatus 111 being switched by the APC unit 117 in such a manner that the power is detected using the first detector diode 112. The APC unit 117 sets the power control signal on the basis of the detected power and the target value signal. In this case, the target value signal is determined on the basis of the curves 202 and 203.

As soon as the first level 206 is reached, the output signal level is held until the dynamic range of the power detector 107 is changed over at a second point in time 207. For the embodiment in FIG. 1, this is effected by virtue of the fact that the APC unit 117 changes the switching state of the switching apparatus 111 and the power level is now detected using the second detector diode 113.

The power level of the output transmission signal is then increased further from the first level 206 by the APC unit 117 in an open loop until the APC unit 117 changes over to a closed loop mode at a third point in time 208. Known closed loop regulation of the output power is effected from the third point in time 208.

This procedure is associated with the advantage that the output level which has already been set is precisely known at the second point in time 207 irrespective of variations caused by product deviations, temperature, supply voltage, etc. As a result, the output power is regulated in a stable and repeatable manner with slight deviations in the transition spectrum.

Specifics of exemplary procedures are described below. However, it should be understood that certain acts need not be performed in the order described, and may be modified, and/or may be omitted entirely, depending on the circumstances. However, in one exemplary implementation, the described acts are executed in sequence. Moreover, the acts described may be implemented by a computer, processor or other computing device based on instructions stored on one or more computer-readable storage media. The computer-readable storage media can be any available media that can be accessed by a computing device to implement the instructions stored thereon.

Figure 3:
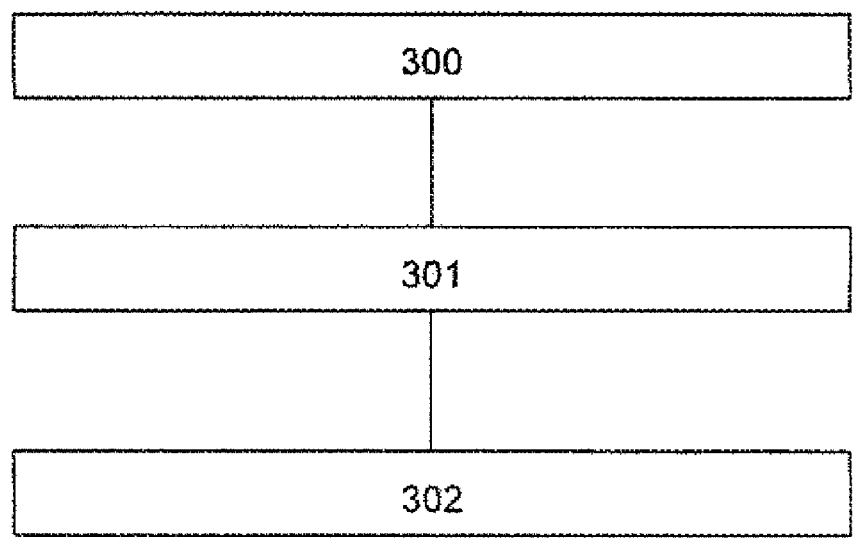
FIG. 3 shows an embodiment of a method for setting an output power of an amplifier apparatus.

FIG. 3 shows an implementation of a method for setting an output power of an amplifier apparatus. In act 300, an output level is increased to a first level by means of a power control signal whilst simultaneously detecting the output level using a first detector (112). This act may comprise the power control signal being regulated by means of a closed control loop.

In act 301, the power control signal is kept constant during an interval of time.

In act 302, the output level is increased by means of the power control signal whilst simultaneously detecting the output level using a second detector (113). The act 302 may comprise the output level being increased to a second level by means of the power control signal. Alternatively, it may be increased for a predefined interval of time without regulation by means of a control loop. The power control signal can be regulated subsequently or from the beginning by means of a closed control loop during the third step 302.

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

The invention claimed is:

1. A method for setting an output level of an amplifier apparatus, comprising:
    increasing the output level to a first level by way of a power control signal whilst simultaneously detecting the output level using a first detector that detects the first level in a first dynamic range;
    keeping the power control signal constant during an interval of time; and
    increasing the output level by way of the power control signal whilst simultaneously detecting the output level using a second detector that detects the first level in a second dynamic range,
    wherein the first detector is not detecting whilst using the second detector.

2. The method as claimed in claim 1, wherein the act of increasing the output level to a first level further comprises regulating the power control signal by way of a closed control loop.

3. The method as claimed in claim 1, wherein the act of increasing the output level by way of the power control signal whilst simultaneously detecting the output level using the second detector further comprises increasing the output level to a second level by way of the power control signal.

4. The method as claimed in claim 3, wherein the act of increasing the output level by way of the power control signal whilst simultaneously detecting the output level using the second detector, to include increasing the output level to a second level by way of the power control signal, further comprises regulating the power control signal by way of a closed control loop.

5. A method for setting an output level of an amplifier apparatus, comprising consecutive acts:
    increasing the output level to a first level by way of a power control signal whilst simultaneously detecting the output level using a power detector in a first dynamic range;
    keeping the power control signal constant during an interval of time;
    changing a power detection range of the power detector; and
    increasing the output level by way of the power control signal whilst simultaneously detecting the output level using the power detector in a second dynamic range.

6. The method as claimed in claim 5, wherein the act of Increasing the output level to the first level further comprises regulating the power control signal by way of a closed control loop.

7. The method as claimed in claim 5, wherein the act of increasing the output level by way of the power control signal whilst simultaneously detecting the output level using the power detector further comprises increasing the output level to a second level by way of the power control signal.

8. The method as claimed in claim 7, wherein following the act of increasing the output level by way of the power control signal whilst simultaneously detecting the output level using the power detector further comprising increasing the output level to the second level by way of the power control signal, performing the act of regulating the power control signal by way of a closed control loop.

* * * * *